United States Patent [19]

Vidovic

[11] 4,071,782
[45] Jan. 31, 1978

[54] PHASELESS EQUALIZER

[75] Inventor: Nikola Vidovic, Santa Clara, Calif.

[73] Assignee: International Video Corporation, Sunnyvale, Calif.

[21] Appl. No.: 700,483

[22] Filed: June 28, 1976

[51] Int. Cl.$^2$ .............................................. H03K 5/01
[52] U.S. Cl. .................................... 307/268; 328/164; 333/28 R; 358/37
[58] Field of Search ...................... 333/28 R, 28 T, 20; 307/264, 268; 328/127, 164, 167; 178/DIG. 25; 358/37, 162, 166, 284

[56] References Cited

U.S. PATENT DOCUMENTS

| | | | |
|---|---|---|---|
| 3,839,598 | 10/1974 | Okada et al. | 178/DIG. 25 |
| 3,849,792 | 11/1974 | Holzrichter | 178/DIG. 25 |
| 3,873,945 | 3/1975 | Muraoka | 328/167 X |
| 3,938,050 | 2/1976 | Corbett et al. | 328/164 X |

Primary Examiner—Paul L. Gensler
Attorney, Agent, or Firm—Limbach, Limbach & Sutton

[57] ABSTRACT

An equalizer in which an input signal is double differentiated without introducing phase shift. First and second differentiating circuits are provided at the input electrode and one of the output electrodes of a transistor. A further circuit is provided at the other transistor output electrode, the circuit having the same time constant as the time constant of the first differentiating circuit. Low pass filters and noise suppression may be included in embodiments particularly useful in video and audio recording and reproducing systems.

28 Claims, 6 Drawing Figures

PHASELESS EQUALIZER

BACKGROUND OF THE INVENTION

The invention relates generally to equalizer circuits and more particularly to an equalizer providing double differentiation without introducing phase shift for all values of input frequency and equalization boost.

Equalizers for use in audio and video systems have been known variously as crispeners, aperture correctors, contour enhancers, shapers, and the like. Typically such circuits are employed to restore high frequency components to waveforms that have suffered loss or degradation of their high frequency information due to processing by bandwidth limited devices. For example, communications links and the record/playback process of magnetic tape and disc equipment often removes or suppresses the high frequency portions of the original signal. In terms of a reproduced television picture, loss of edge definition is the most apparent effect. Equalizers have therefore operated to modify the system degraded waveform in some manner in an attempt to bring it closer to its original form.

One well-known approach in equalizers restoring lost high frequency information is to combine with the main signal a supplemental signal having an amplitude related to the square of the signal frequency. For an input $U_i$, the output is $U_o = U_i(1 \pm k\omega^2)$. Thus, for higher frequencies the output signal is boosted.

Such a correction is theoretically achievable by double differentiation. However, true double differentiation has heretofore been achieved only within narrow limits of input signal frequency. True differentiation is of the form $$A(\omega) = \omega\tau,$$

whereas the conventional differentiator circuit provides a transfer function of the form $$A(\omega) = \frac{\omega\tau}{\sqrt{1 + (\omega\tau)^2}}.$$

This function approximates true differentiation only for small values of $\omega\tau$ as seen in FIG. 1 which shows plots of $A(\omega)$ versus $\omega\tau$ for true and conventional differentiation.

Double differentiation achieved by conventional differentiation circuits results in the function shown in FIG. 1. Beyond small values of $\omega\tau$, this function departs radically from the true double differentiation curve $(\omega\tau)^2$.

Such conventional double differentiation techniques introduce significant phase shift, except at small values of $\omega\tau$. Many signal processing applications are extremely sensitive to phase shift, making such prior art techniques unacceptable.

SUMMARY OF THE INVENTION

In accordance with the teachings of the present invention, an equalizer is provided which introduces essentially no phase shift for all values of input signal frequency.

The heart of the invention is a single transistor stage having two differentiating circuits and a time constant compensating circuit. An output signal including the term $k\omega^2 U_i$, where $U_i$ is the input signal and $k$ is an adjustable boost level, is achieved.

An output signal of the form $U_o = U_i(1+k\omega^2)$ is provided by combining the high frequency boost signal with the input signal.

In one preferred embodiment a non-linear device for suppressing noise forms an integral part of one of the differentiating circuits.

Low pass filtering is optionally provided to shape the high frequency boost characteristic.

The inventive equalizer provides a symmetrical output for essentially any boost level and true double differentiation without phase shift for essentially any input frequency.

FIG. 2, for example, in (a) shows a square wave pulse that has suffered high frequency losses by a limited bandwidth process. In FIG. 2(b) the result of conventional differentiation on the pulse is seen. Conventional double differentiation produces the pulse shown in FIG. 2(c), having asymmetrical trailing and leading edges. FIG. 2(d), however, shows the pulse as processed by double differentiation without phase shift according to the present invention. The resulting waveform is essentially symmetrical.

These and other advantages and features of the invention will be further understood as the following description and drawings are read and understood.

DESCRIPTION OF THE PREFERRED EMBODIMENTS

Figure 1:
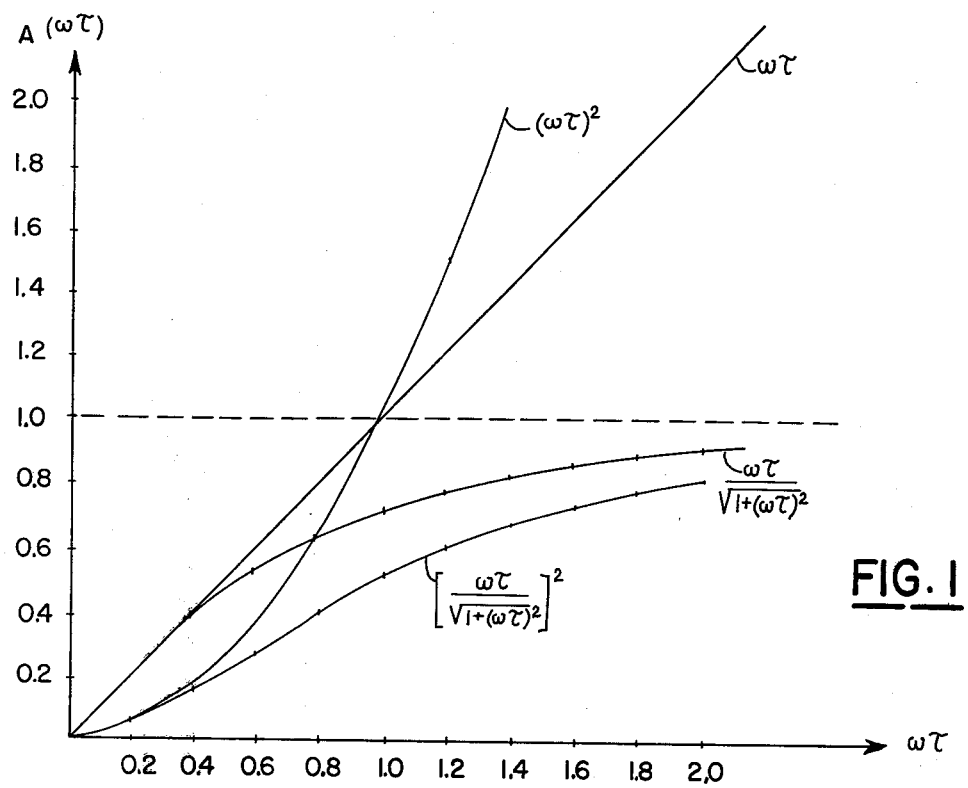
FIG. 1 is a series of curves showing conventional and actual single and double differentiation functions.
Figure 2:
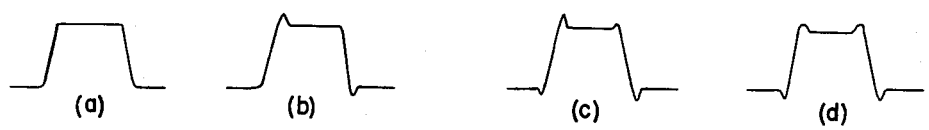
FIGS. 2(a) – 2(d) show the effect of conventional and actual single and double differentiation on a particular input waveform.
Figure 3:
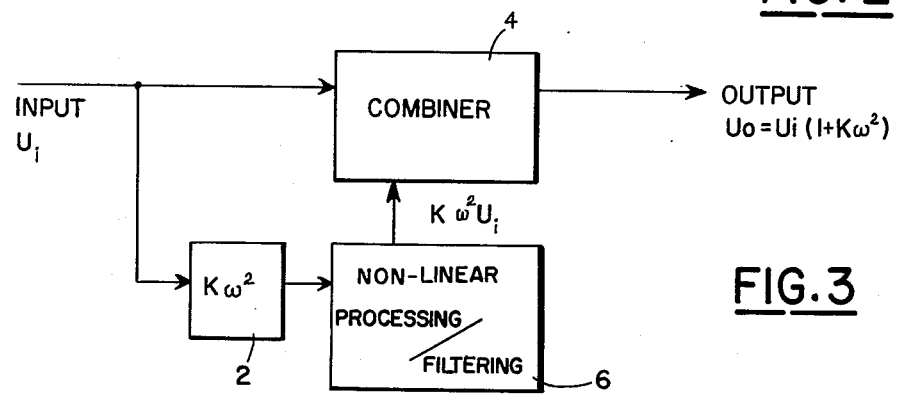
FIG. 3 is a functional block diagram of the general form of an equalizer according to the present invention.

Referring now to the drawings and particularly to FIG. 3 which shows a functional generalized block diagram of an equalizer according to the present invention, an input signal $U_i$ is applied to a block 2 providing the transfer function $k\omega^2$ and to a combiner 4. The output of block 2 is applied to an optional processing block 6 that provides non-linear processing and/or filtering. The two inputs to combiner 4 may be added or subtracted as desired, depending on the manner in which the input signal is to be modified. Alternately, the output signal $U_o$ may be chosen to include only the output of blocks 2 or 6.

As will be understood from the following descriptions of the preferred embodiments, the functional block 2 comprises a single transistor stage having double differentiation and time constant compensation: a first differentiating circuit in the control electrode of the transistor; a second differentiating stage in one of the output electrodes; and a time constant compensation in the other of the output electrodes. Filtering and non-linear processing can be accomplished using some of the same circuit elements that provide the differentiation and time constant compensation. Also, the signal combining function can also be effectuated using some of the same circuit elements that provide differentiation or time constant compensation functions.

Figure 4:
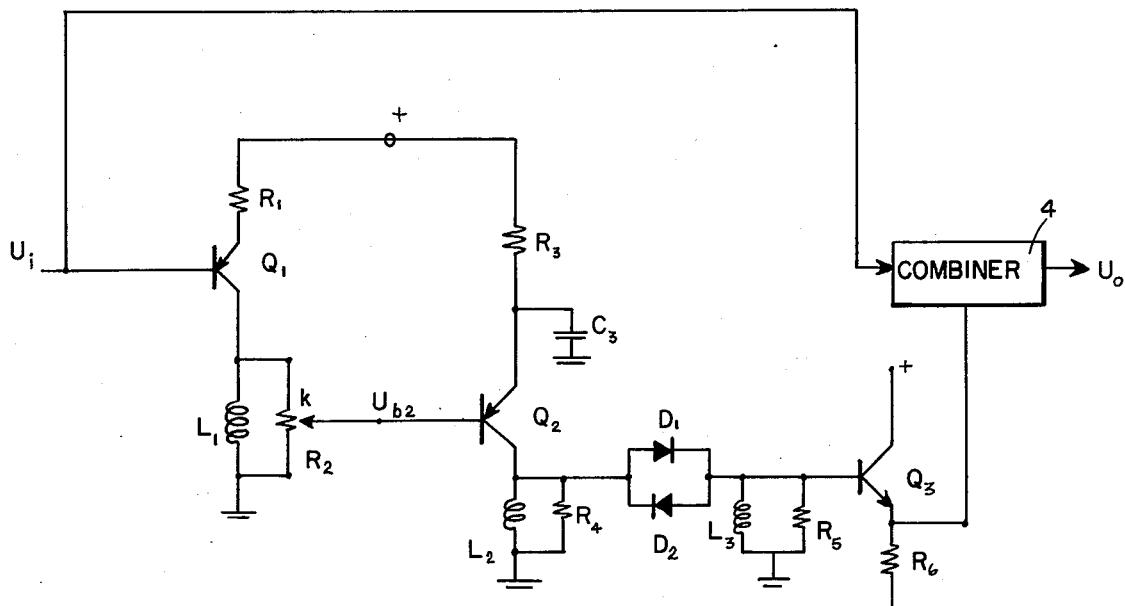
FIG. 4 is a schematic diagram of one preferred embodiment of the invention including means for noise suppression.

FIG. 4 shows a first preferred embodiment of the invention, having both non-linear processing and filtering in addition to the basic $k\omega^2$ transfer function. Although this embodiment is particularly adapted for use as a video signal crispener, the principles inherent in the embodiment are not so limited.

The input signal $U_i$ is applied to a combiner 4 and to the base of an emitter follower input stage $Q_1$ which acts as a source of variable current to the parallel combination of $L_1$ and $R_2$ in response to the input voltage $U_i$. The current from the collector develops a voltage across the parallel combination which can be adjustably fed to the base of $Q_2$ by adjusting the rider. The junction of $L_1 R_2$ opposite $Q_1$ is grounded. Inductor $L_1$ provides differentiation of the input signal and prevents any DC shift as $R_2$ is adjusted. Resistor $R_1$ is a load resistor connecting the emitter of $Q_1$ to the positive supply voltage.

The voltage $U_{b2}$ at the base of amplifier $Q_2$ is $$\frac{-R_2 j\omega L_1}{(R_2 + j\omega L_1)R_1} kU_i$$

Thus, a first conventional differentiation of the input signal is provided at the control electrode or base of $Q_2$. Amplifier stage $Q_2$ is the basic element of the equalizer which develops the $k\omega^2$ transfer function, as will be explained.

One of the $Q_2$ output electrodes, the emitter of $Q_2$, is connected to the positive supply voltage through load resistor $R_3$. Capacitor $C_3$ is connected between the junction of the $Q_2$ emitter and ground. $R_3$ and $C_3$ are effectively in parallel since the positive supply point is at AC ground. The parallel impedance of $R_3$ and $C_3$ is $$\frac{R_3 \frac{1}{j\omega C_3}}{R_3 + \frac{1}{j\omega C_3}} = \frac{R_3}{1 + j\omega R_3 C_3}.$$

$R_3$ and $C_3$ provide time constant compensation for the first differentiating circuit elements $L_1$ and $R_2$. The values of the respective components are chosen to essentially provide the equality $$R_3 C_3 = \frac{L_1}{R_2}.$$

The collector circuit of $Q_2$ includes elements providing the second differentiation and providing filtering and non-linear processing.

Figure 5:
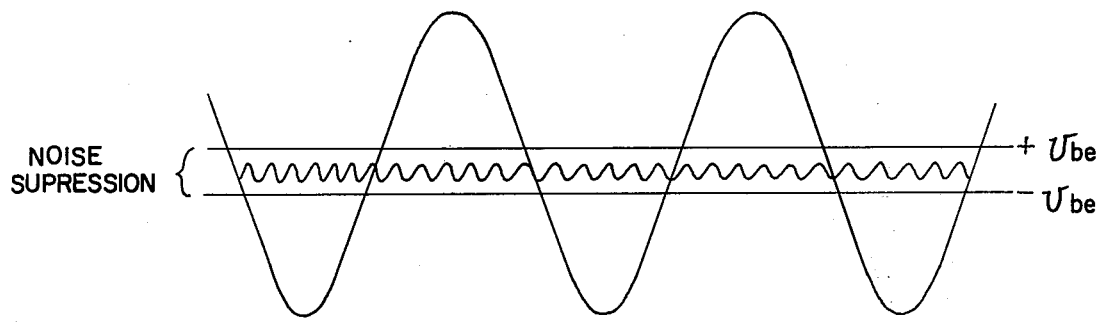
FIG. 5 is a waveform useful in understanding the noise suppression effect of the circuit of FIG. 4.

The back-to-back diodes $D_1$ and $D_2$ provide non-linear processing. In this case, noise suppression is achieved because the diodes suppress the mid-portion of the waveform between plus and minus their reverse bias voltage $\pm v_{bc}$. This amplitude portion of the signal generally contains all of the noise as shown in FIG. 5. Thus, the noise is not boosted by the $k\omega^2$ function.

The arrangement of parallel inductor-resistor pairs on either side of diodes $D_1$–$D_2$ assures that no bias is applied to the diodes.

The first inductor-resistor pair $R_4 L_2$ is connected between one of the output electrodes, the collector, of $Q_2$ and ground. The other pair $L_3 R_5$ is connected between the junction of $D_1$–$D_2$ distant from the collector of $Q_2$ and ground. The former junction is further connected to the base of an output emitter follower $Q_3$ that has its collector connected to the positive supply and its emitter providing the output and connected to the negative supply through load resistor $R_6$.

Inductors $L_2$ and $L_3$ provide the second differentiation. Preferably $L_2$ is smaller than $L_3$ so that the noise is boosted less prior to suppression by the diodes. Resistors $R_4$ and $R_5$ function to provide high frequency roll off of the boosted signal.

The voltage at the collector of $Q_2$ is $$U_{c2} = -\frac{Z_c}{Z_e} U_{b2},$$

where $Z_c$ and $Z_e$ are the collector and emitter impedances, respectively. Or, $$U_{c2} = \frac{-Z_c}{\frac{R_3}{1 + j\omega R_3 C_3}} U_{b2}$$

$$U_{c2} = kU_i \frac{Z_c j\omega L_1}{R_1 R_3}$$

Let $L_o = \frac{L_2 L_3}{L_2 + L_3}$ and $Z_c \approx j\omega L_o$ then $U_{c2} = -\frac{kU_i \omega^2 L_o L_1}{R_1 R_3}$ Thus, the output of the $Q_2$ stage is of the form $$U_{c2} = a\omega^2 U_i.$$

The output of $Q_3$ is applied along with the input signal $U_i$ to a combiner 4 to provide the output signal of the form $$U_o = (1 \pm k\omega^2)U_i$$

Non-linear processing may also be provided by means other than back-to-back diodes D1–D2. For example, adjustable positions and negative threshold detectors can be used to adjustably remove the smaller amplitude signals. Such detectors, which are well-known in the art and which typically are active devices, can be located between the output of the $Q_3$ stage and combiner 4. In the event such threshold detectors are used, the diodes D1 and D2 are omitted and $L_2$ and $L_3$ and $R_4$ and $R_5$ are respectively combined.

Figure 6:
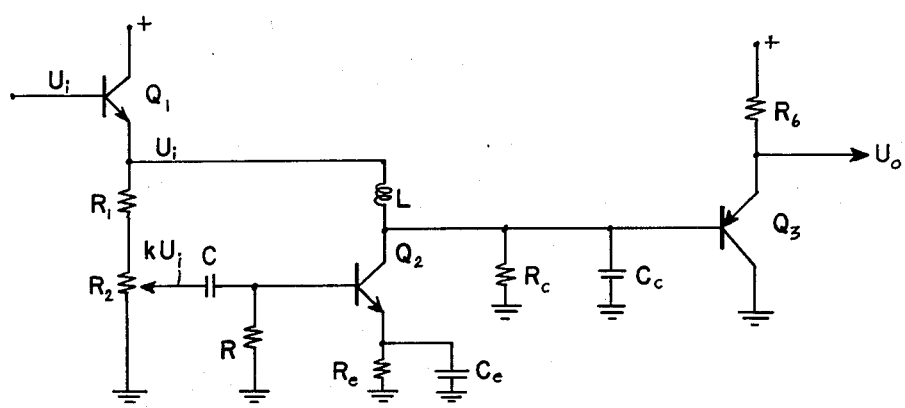
FIG. 6 is a schematic diagram of another preferred embodiment of the invention including a low pass filter for rolling of the high frequency boost.

FIG. 6 shows an alternative preferred embodiment, optionally having a low pass filter to roll off high frequency components to the extent desired by selecting the filter 3db point. Due to the judicious manner in which the components are configured no external combiner is required. Although this embodiment is particularly adapted for use as an audio signal crispener, the principles inherent in the embodiment are not so limited.

The input signal $U_i$ is applied to an emitter follower $Q_1$ that acts as a source of variable current to develop a voltage across potentiometer $R_2$ that is responsive to the input signal. $R_1$ in series with $R_2$ acts as a load resistor along with $R_2$ and the far end of $R_2$ is connected to ground.

An RC differentiator circuit is connected between the rider of $R_2$ and the control electrode or base of $Q_2$: capacitor C is in series between the rider and the base and resistor R is between the base and ground. The voltage at the base of the emitter follower $Q_2$ is $$U_{b2} = kU_i \left( \frac{R}{R + \frac{1}{j\omega C}} \right), \text{or}$$

$$U_{b2} = kU_i \left( \frac{j\omega RC}{1 + j\omega RC} \right).$$

Thus, a first conventional differentiation of the input signal is provided to the base of $Q_2$. Emitter follower amplifier stage $Q_2$ is the basic element of the equalizer which develop the $k\omega^2$ transfer function.

A second differentiation is provided by inductor L between one of the output electrodes, the collector of $Q_2$ and the emitter of $Q_1$. Input signal $U_i$ is also present at the collector of $Q_2$ because being a current source there is essentially no voltage drop in L. Thus the collector junction of $Q_2$ is a combining node of the input signal $U_i$ and the boosted signal $k\omega^2 U_i$.

Parallel resistor-capacitor $R_e C_e$ between the other output electrode, the emitter of $Q_2$ and ground provide the time constant compensation for the RC differentiator. The values of the respective components are chosen to essentially provide the equality $$RC = R_e C_e.$$

The voltage at the collector of $Q_2$ is thus (ignoring $R_c$ and $C_c$):

$$U_{c2} = \frac{\frac{-j\omega L}{R_e}}{1 + j\omega R_e C_e} \cdot U_{b1} + U_i$$

$$U_{c2} = U_i(1 + k\omega^2 L C_e)$$

Thus, the output of the $Q_2$ stage is of the form $$U_{c2} = U_i(1 + a\omega^2)$$

If desired, the elements $R_c$ and $C_c$ may be added to provide controllable low pass filtering. The elements L, $C_c$ and $R_c$ function as a Bessel or maximally flat filter in accordance with conventional filter theory. $R_c$ acts as a termination for the filter.

The collector of $Q_2$ is connected to the base of an output emitter follower stage $Q_3$ which has its collector grounded and its output taken at the emitter. A load resistor connects the emitter to the positive supply.

Threshold detectors such as described in connection with FIG. 4 may also be used at the output of $Q_3$ of FIG. 6.

In both preferred embodiments the degree of $\omega^2$ boosting is controlled by adjusting the potentiometer $R_2$, thus changing the k-factor in the output transfer function. By selecting $k$ and the 3db point of low pass filters, if used, the equalization shaping can be varied over a wide range as may be required for particular applications.

Various modifications of the preferred embodiments will be apparent to those of ordinary skill in the art. The invention is therefore to be limited only by the scope of the appended claims.

It is claimed:

1. Apparatus for generating an output signal corresponding to the double differentiation of the input signal without introducing phase shift comprising
   amplifier means including a transistor having a control electrode and a first and a second output electrode,
   means including a first differentiating circuit for applying said input signal to said control electrode, said first differentiating circuit having a selectable time constant,
   means including a second differentiating circuit connected between one of said output electrodes and AC ground,
   means including a circuit having a selectable time constant connected between the other of said output electrodes and AC ground, the time constant of said circuit being substantially equal to the time constant of said first differentiating circuit, and
   means connected to said one of said output electrodes for providing said output signal.

2. The combination of claim 1 wherein said means for applying said input signal to said control electrode further includes means for selectively adjusting the amplitude of said input signal.

3. The combination of claim 2 wherein said means for selectively adjusting the amplitude of said input signal comprises
   means receiving said input signal for providing a current responsive to said input signal,
   potentiometer means receiving said current for developing a voltage responsive to said current, the rider of said potentiometer means providing said selectively adjustable input signal amplitude.

4. The combination of claim 1 wherein said means connected to said one of said output electrodes for providing said output signal includes a transistor stage configured as an emitter follower.

5. The combination of claim 1 wherein said means for applying said input signal to said control electrode further includes means for selectively adjusting the amplitude of said input signal and wherein said means connected to said one of said output electrodes for providing said output signal includes a transistor stage configured as an emitter follower.

6. The combination of claim 5 wherein said means for selectively adjusting the amplitude of said input signal comprises
   means receiving said input signal for providing a current responsive to said input signal,
   potentiometer means receiving said current for developing a voltage responsive to said current, the rider of said potentiometer means providing said selectively adjustable input signal amplitude.

7. Apparatus for boosting the high frequency components of an input signal without introducing phase shift to provide a crispened output signal comprising
   amplifier means including a transistor having a control electrode and a first and a second output electrode,
   means including a first differentiating circuit for applying said input signal to said control electrode, said first differentiating circuit having a selectable time constant, means including a second differentiating circuit connected between one of said output electrodes and AC ground, means including a circuit having a selectable time constant connected between the other of said output electrodes and AC ground, the time constant of said circuit being substantially equal to the time constant of said first differentiating circuit, means for combining first and second applied signals to provide an output signal, said combiner means receiving said input signal as one of said applied signals, and means for connecting said one of said output electrodes to said combiner means as the other of said applied signals, whereby said combiner means output signal is said crispened output signal.

8. The combination of claim 7 wherein said means for applying said input signal to said control electrode further includes means for selectively adjusting the amplitude of said input signal.

9. The combination of claim 8 wherein said means for selectively adjusting the amplitude of said input signal comprises means receiving said input signal for providing a current responsive to said input signal, potentiometer means receiving said current for developing a voltage responsive to said current, the rider of said potentiometer means providing said selectively adjustable input signal amplitude.

10. The combination of claim 7 wherein said means for connecting said one of said output electrodes to said combiner means includes means for suppressing the portion of signals present at said one of said output electrodes having an amplitude less than a predetermined value.

11. The combination of claim 10 wherein said means for applying said input signal to said control electrode further includes means for selectively adjusting the amplitude of said input signal.

12. The combination of claim 11 wherein said means for selectively adjusting the amplitude of said input signal comprises means receiving said input signal for providing a current responsive to said input signal, potentiometer means receiving said current for developing a voltage responsive to said current, the rider of said potentiometer means providing said selectively adjustable input signal amplitude.

13. The combination of claim 7 wherein said means for connecting said one of said output electrodes to said combiner means includes high pass filter means for rolling off of high frequency signal components.

14. The combination of claim 7 further comprising parallel resistance means and capacitance means connected between said one of said output electrodes and ground and wherein said means including a second differentiating circuit operates in conjunction with said parallel resistance means and capacitance means to low pass filter said input signal.

15. The combination of claim 14 wherein said means operating in conjunction to low pass filter said input signal further operate to provide a Bessel type low pass filter.

16. Apparatus for generating an output signal $U_o$ of the form $U_o = K\omega^2 U_i$, where $U_i$ is the input signal, comprising amplifier means including a transistor, having a control electrode and a first and a second output electrode, means for applying said input signal to said control electrode, circuit means connected to the control electrode and one of said output electrodes for double differentiating said input signal, circuit means connected to the other of said output electrodes for compensating for the time constant of the portion of said double differentiating circuit means connected to said control electrode, and means connected to said one of said output electrodes for providing said output signal.

17. Apparatus for generating an output signal $U_o$ of the form $U_o = U_i(1 \pm k\omega^2)$ where $U_i$ is the input signal, comprising amplifier means including a transistor, having a control electrode and a first and second output electrode, means for applying said input signal to said control electrode, circuit means connected to the control electrode and one of said output electrodes for double differentiating said input signal, circuit means connected to the other of said output electrodes for compensating for the time constant of the portion of said double differentiating circuit means connected to said control electrode, means for combining first and second applied signals to provide an output signal, said combiner means receiving said input signal as one of said applied signals, and means for connecting said one of said output electrodes to said combiner means as the other of said applied signals whereby said combiner means output is said output signal $U_o$.

18. Apparatus for boosting the high frequency components of an input signal without introducing phase shift to provide a crispened output signal comprising amplifier means including a transistor, having a control electrode and a first and second output electrode, means receiving said input signal for providing a current responsive to said input signal, potentiometer means, having an adjustable rider, receiving said current for developing a voltage responsive to said current, first differentiating circuit means having a selectable time constant connected between the rider of said potentiometer and said control electrode, second differentiating circuit means comprising inductor means receiving said current and connected to one of said output electrodes, circuit means having a selectable time constant connected between the other of said output electrodes and AC ground, the time constant of said circuit means being substantially equal to the time constant of said first differentiating circuit means, and output means connected to said one of said output electrodes for providing said output signal.

19. The combination of claim 18 wherein said output means includes a low pass filter.

20. The combination of claim 19 wherein said output means further includes an emitter follower type transistor stage following said low pass filter.

21. The combination of claim 18 wherein said first differentiating circuit means comprises capacitor means connected in series between said potentiometer rider and said control electrode and resistor means connected between said control electrode and AC ground.

22. The combination of claim 21 wherein said circuit means comprises capacitor means and resistor means connected in parallel.

23. Apparatus for boosting the high frequency components of an input signal without introducing phase shift to provide a crispened output signal comprising
amplifier means including a transistor, having a control electrode and a first and a second output electrode,
means receiving said input signal for providing a current responsive to said input signal,
first differentiating circuit means having a selectable time constant receiving said current, said circuit means including parallel inductor means and potentiometer means having an adjustable rider,
means for connecting said rider to the said control electrode,
first circuit means having a selectable time constant connected between one of said output electrodes and AC ground, the time constant of said circuit means being substantially equal to the time constant of said first differentiating means, and
output means including second differentiating circuit means connected to the other of said output electrodes, said output means including non-linear process means.

24. The combination of claim 23 wherein said non-linear process means comprises a pair of back-to-back diodes and said second differentiating circuit means comprises a pair of parallel inductor means and resistor means, one of said parallel pair being connected between the junction of one end of said diodes and said other output electrode on one hand and AC ground on the other hand and the other of said parallel pair being connected between the other end of said diodes and AC ground.

25. The combination of claim 24 wherein said output means further comprises an emitter follower configured transistor stage having its input connected to the junction of said second pair of parallel inductor means and resistor means and said other end of said diodes.

26. The combination of claim 23 further comprising combiner means receiving said input signal and the signal from said output means for combining said signals to provide a final output signal.

27. The combination of claim 25 further comprising combiner means receiving said input signal and the signal output of said emitter follower for combining said signals to provide a final output signal.

28. The combination of claim 23 wherein said non-linear process means comprises positive and negative threshold detector means.

* * * * *